United States Patent
Fukumizu et al.

(10) Patent No.: US 10,181,561 B2
(45) Date of Patent: Jan. 15, 2019

(54) MEMORY DEVICE

(71) Applicant: Toshiba Memory Corporation, Minato-ku (JP)

(72) Inventors: Hiroyuki Fukumizu, Yokohama (JP); Takeshi Yamaguchi, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/644,282

(22) Filed: Jul. 7, 2017

(65) Prior Publication Data
US 2018/0013061 A1    Jan. 11, 2018

(30) Foreign Application Priority Data
Jul. 8, 2016 (JP) ................................. 2016-135827

(51) Int. Cl.
  *H01L 45/00* (2006.01)
  *G11C 13/00* (2006.01)
  *H01L 27/24* (2006.01)

(52) U.S. Cl.
  CPC ............ *H01L 45/10* (2013.01); *G11C 13/004* (2013.01); *G11C 13/0007* (2013.01); *G11C 13/0026* (2013.01); *G11C 13/0028* (2013.01); *H01L 27/2409* (2013.01); *H01L 27/2463* (2013.01); *H01L 27/2481* (2013.01); *H01L 45/04* (2013.01); *H01L 45/1233* (2013.01); *H01L 45/1253* (2013.01); *H01L 45/1273* (2013.01);
(Continued)

(58) Field of Classification Search
  CPC ............... H01L 45/1233; H01L 45/146; H01L 45/1246; H01L 45/1253; H01L 45/14; H01L 45/145
  See application file for complete search history.

(56) References Cited

U.S. PATENT DOCUMENTS

| | | | |
|---|---|---|---|
| 8,537,594 B2 * | 9/2013 | Wada | G11C 11/5685 365/148 |
| 9,007,809 B2 * | 4/2015 | Fukumizu | G11C 13/0002 365/148 |

(Continued)

FOREIGN PATENT DOCUMENTS

| | | |
|---|---|---|
| JP | 2006-32397 | 2/2006 |
| JP | 2009-88261 | 4/2009 |

(Continued)

*Primary Examiner* — Nicholas J Tobergte
(74) *Attorney, Agent, or Firm* — Oblon, McClelland, Maier & Neustadt, L.L.P.

(57) ABSTRACT

According to one embodiment, a memory device includes a stacked body. The stacked body includes first and second electrodes, and an oxide layer provided between the first and second electrodes. The second electrode includes a semiconductor layer, and a metal-containing region including at least one of first or second metallic element and being provided between at least a portion of the semiconductor layer and at least a portion of the oxide layer. The first metallic element includes at least one selected from Pt, Pd, Ir, Ru, Re, and Os. The second metallic element includes at least one selected Ti, W, Mo, and Ta. The stacked body has first and second states. The first state is obtained by causing a current to flow in the stacked body from the second toward first electrode. The second state is obtained by causing a current to flow from the first toward second electrode.

12 Claims, 11 Drawing Sheets

(52) U.S. Cl.
    CPC .... *H01L 45/146* (2013.01); *G11C 2013/0042* (2013.01)

(56) References Cited

U.S. PATENT DOCUMENTS

| | | | |
|---|---|---|---|
| 9,761,635 B1* | 9/2017 | Jo | H01L 45/085 |
| 2008/0296550 A1* | 12/2008 | Lee | H01L 27/2409 |
| | | | 257/2 |
| 2009/0039332 A1* | 2/2009 | Lee | H01L 45/04 |
| | | | 257/4 |
| 2012/0049306 A1 | 3/2012 | Ohba et al. | |
| 2013/0010522 A1* | 1/2013 | Kanzawa | G11C 13/0007 |
| | | | 365/148 |
| 2013/0099191 A1* | 4/2013 | Kuse | H01L 45/146 |
| | | | 257/4 |
| 2013/0188414 A1* | 7/2013 | Kawai | G11C 13/0069 |
| | | | 365/148 |
| 2013/0301339 A1 | 11/2013 | Fukumizu et al. | |
| 2014/0166966 A1* | 6/2014 | Nishioka | H01L 45/08 |
| | | | 257/4 |

FOREIGN PATENT DOCUMENTS

| | | |
|---|---|---|
| JP | 2009-185860 | 8/2009 |
| JP | 2009-218438 | 9/2009 |
| JP | 2012-54321 | 3/2012 |
| JP | 2013-235956 | 11/2013 |
| JP | 2014-165332 | 9/2014 |

\* cited by examiner

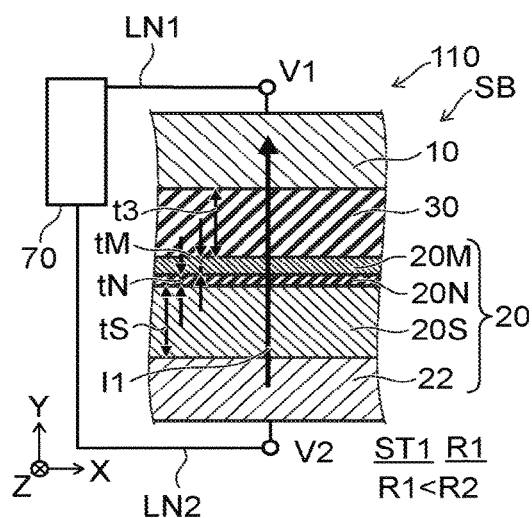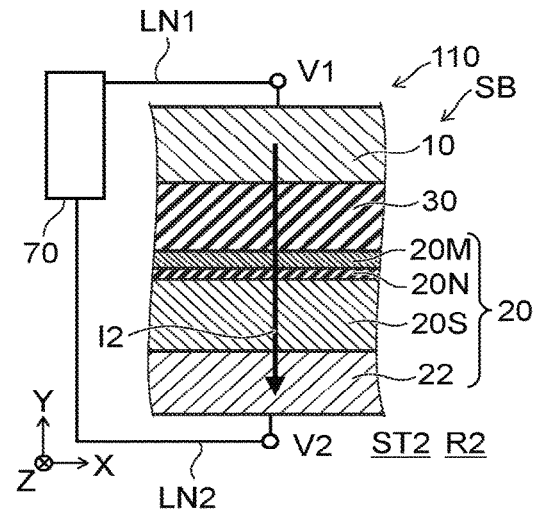
FIG. 1A  FIG. 1B
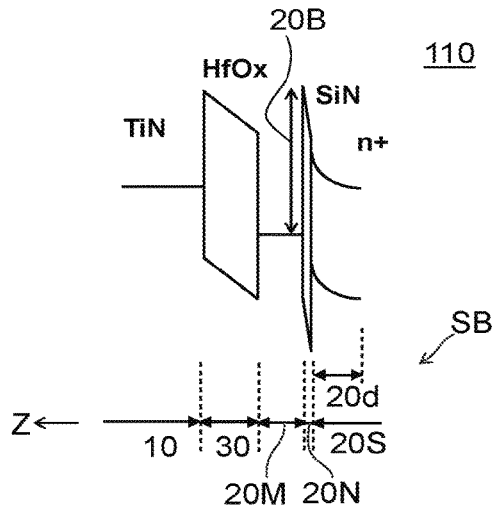
FIG. 2

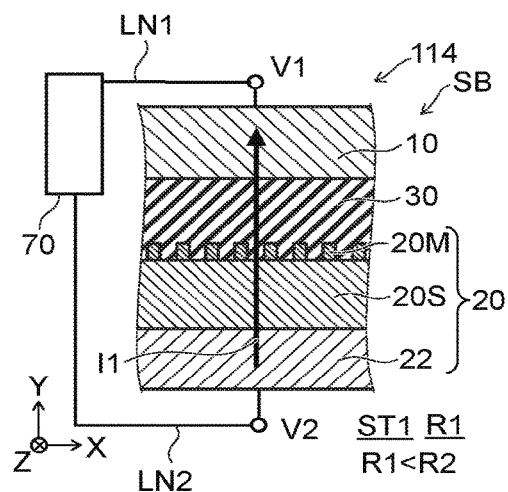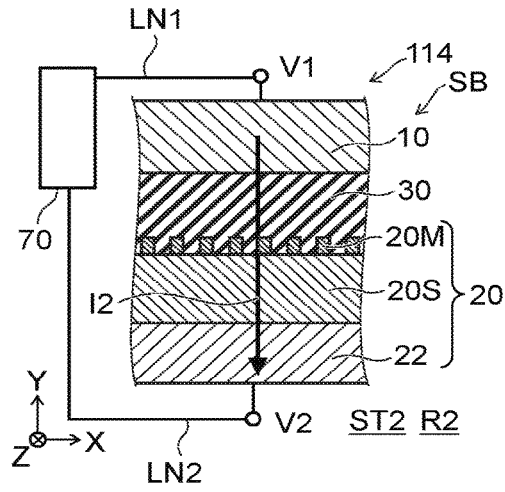
FIG. 9A  FIG. 9B
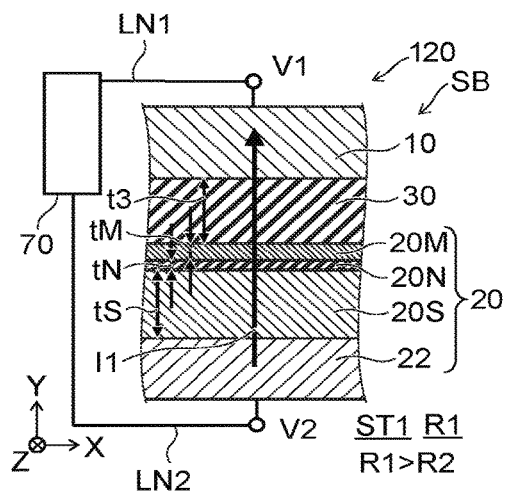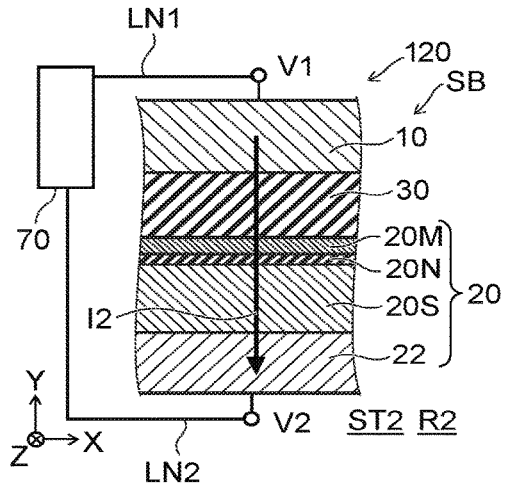
FIG. 10A  FIG. 10B

MEMORY DEVICE

CROSS-REFERENCE TO RELATED APPLICATIONS

This application is based upon and claims the benefit of priority from Japanese Patent Application No. 2016-135827, filed on Jul. 8, 2016; the entire contents of which are incorporated herein by reference.

FIELD

Embodiments described herein relate generally to a memory device.

BACKGROUND

A memory device that uses a variable resistance element in which the resistance changes has been proposed. It is desirable to reduce the operating current of the memory device.

BRIEF DESCRIPTION OF THE DRAWINGS

FIG. 1A and FIG. 1B are schematic cross-sectional views illustrating a memory device according to a first embodiment;

FIG. 2 is a schematic view illustrating the memory device according to the first embodiment;

FIG. 9A and FIG. 9B are schematic cross-sectional views illustrating another memory device according to the first embodiment;

FIG. 10A and FIG. 10B are schematic cross-sectional views illustrating a memory device according to a second embodiment;

Figure 3:
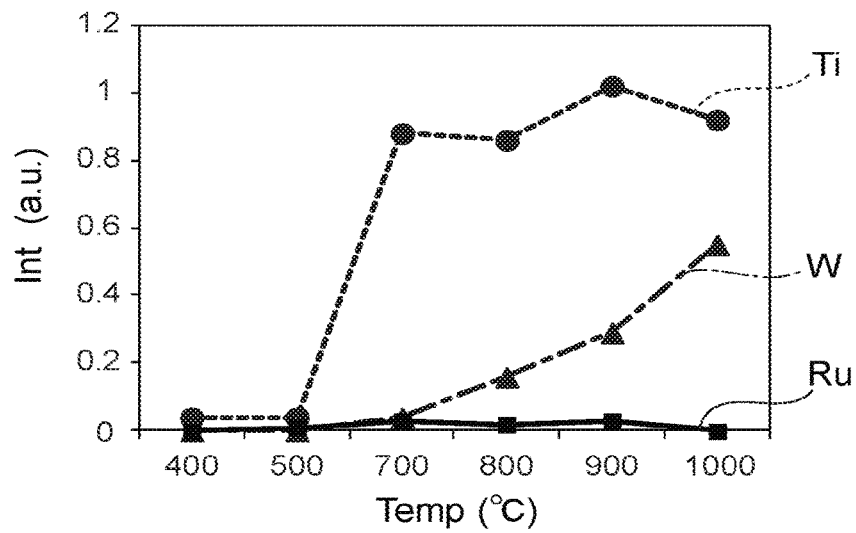
FIG. 3 is a graph illustrating characteristics of the memory device.

According to one embodiment, a memory device includes a stacked body. The stacked body includes a first electrode, a second electrode, and an oxide layer provided between the first electrode and the second electrode. The second electrode includes a semiconductor layer of an n-type, and a metal-containing region including at least one of a first metallic element or a second metallic element and being provided between at least a portion of the semiconductor layer and at least a portion of the oxide layer. The first metallic element includes at least one selected from the group consisting of Pt, Pd, Ir, Ru, Re, and Os. The second metallic element includes at least one selected from the group consisting of Ti, W, Mo, and Ta. The stacked body has a first state and a second state. The first state is obtained by causing a first current to flow in the stacked body from the second electrode toward the first electrode. The second state is obtained by causing a second current to flow in the stacked body from the first electrode toward the second electrode. A first resistance of the stacked body in the first state is lower than a second resistance of the stacked body in the second state.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1A and FIG. 1B are schematic cross-sectional views illustrating a memory device according to a first embodiment.

As shown in FIG. 1A and FIG. 1B, the memory device 110 according to the embodiment includes a stacked body SB. The stacked body SB includes a first electrode 10, a second electrode 20, and an oxide layer 30. The oxide layer 30 is provided between the first electrode 10 and the second electrode 20.

The direction from the second electrode 20 toward the first electrode 10 is taken as a first direction. The first direction is taken as a Z-axis direction. One direction perpendicular to the Z-axis direction is taken as an X-axis direction. A direction perpendicular to the Z-axis direction and the X-axis direction is taken as a Y-axis direction.

The oxide layer 30 includes, for example, hafnium oxide, etc. Other examples of the material of the oxide layer 30 are described below. The oxide layer 30 is, for example, a variable resistance layer.

The second electrode 20 includes a semiconductor layer 20S of an n-type and includes a metal-containing region 20M. The metal-containing region 20M is provided between at least a portion of the semiconductor layer 20S and at least a portion of the oxide layer 30. As described below, the metal-containing region 20M may have an island configuration, a mesh configuration, etc. In the case of an island configuration, multiple regions are provided to be separated from each other. In the case of a mesh configuration, multiple holes are provided.

The n-type semiconductor layer 20S includes, for example, n-type polysilicon, etc. The semiconductor layer 20S includes, for example, silicon. The semiconductor layer 20S further includes at least one of phosphorus, arsenic, or antimony (an impurity).

The metal-containing region 20M includes at least one of a first metallic element or a second metallic element. The first metallic element includes at least one selected from the group consisting of Pt, Pd, Ir, Ru, Re, and Os. The second metallic element includes at least one selected from the group consisting of Ti, W, Mo, and Ta. The metal-containing region 20M may include at least one of a nitride of the second metallic element or a nitride of the second metallic element.

For example, the metal-containing region 20M may be formed by sputtering, CVD (Chemical Vapor Deposition), etc. CVD includes ALD (Atomic Layer Deposition).

In the example, the second electrode 20 further includes a nitrogen-containing region 20N. The nitrogen-containing region 20N is provided between at least a portion of the semiconductor layer 20S and at least a portion of the metal-containing region 20M. The nitrogen-containing region 20N includes Si and N. As described below, the nitrogen-containing region 20N may have an island configuration, a mesh configuration, etc.

In the example, the second electrode 20 further includes a conductive layer 22. For example, the conductive layer 22 has a good electrical connection with the semiconductor layer 20S.

The first electrode 10 and the conductive layer 22 include, for example, a conductive material such as TiN, etc. Other examples of materials included in the first electrode 10 and the conductive layer 22 are described below.

The resistance of such a stacked body SB changes. For example, the change occurs due to the change of the resistance of the oxide layer 30. Multiple states that have a plurality of resistance values exist in the stacked body SB. The multiple states will now be described.

FIG. 1A shows an example of a first state ST1. FIG. 1B shows an example of a second state ST2. The first state ST1 is obtained by causing a first current I1 to flow in the stacked body SB. The first current I1 is a current from the second electrode 20 toward the first electrode 10. The second state ST2 is obtained by causing a second current I2 to flow in the stacked body SB. The second current I2 is a current from the first electrode 10 toward the second electrode 20. The operation of forming the first state ST1 (the operation of causing the first current I1 to flow in the stacked body SB) corresponds to, for example, a set operation. The operation of forming the second state ST2 (the operation of causing the second current I2 to flow in the stacked body SB) corresponds to, for example, a reset operation.

Such operations are performed by a controller 70. For example, the controller 70 is electrically connected to the first electrode 10 via a first interconnect LN1. For example, the controller 70 is electrically connected to the second electrode 20 via a second interconnect LN2. By the controller 70, the potential of the first electrode 10 is set to a first potential V1; and the potential of the second electrode 20 is set to a second potential V2. The operations recited above are implemented by controlling the first potential V1 and the second potential V2.

In the memory device 110 according to the embodiment, a first resistance R1 of the stacked body SB in the first state ST1 is lower than a second resistance R2 of the stacked body SB in the second state ST2. For example, a bipolar operation is performed in the memory device 110. The multiple resistance states correspond to stored information.

In the embodiment, for example, the metal-containing region 20M is not an electrode for supplying a current. A thickness tM of the metal-containing region 20M is relatively thin. The thickness tM is the length of the metal-containing region 20M along the Z-axis direction (the first direction from the second electrode 20 toward the first electrode 10). On the other hand, it is possible for a current to flow in the nitrogen-containing region 20N. For example, a thickness tN of the nitrogen-containing region 20N is relatively thin. The thickness tN is the length of the nitrogen-containing region 20N along the Z-axis direction.

It was found that the operating current (the cell current) can be small in the memory device 110 having such a configuration. An example of the characteristics of the memory device 110 will now be described.

FIG. 2 is a schematic view illustrating the memory device according to the first embodiment.

FIG. 2 is an energy band diagram of the stacked body SB of the memory device 110.

As shown in FIG. 2, the metal-containing region 20M is provided in the embodiment. Thereby, a band offset 20B is formed in the region between the semiconductor layer 20S and the metal-containing region 20M. For example, the electron trapping probability of the metal-containing region 20M is higher than the electron trapping probability of the semiconductor layer 20S (e.g., polysilicon). The work function of the metal-containing region 20M is large. Thereby, a current flows easily at a low electric field strength in the oxide layer 30 (e.g., hafnium oxide). For example, the resistance of the oxide layer 30 is low in the first state ST1 obtained by the set operation. The flow into the semiconductor layer 20S of the electrons flowing through the oxide layer 30 in the set operation is suppressed by the band offset 20B. Thereby, the operating current (e.g., the current after the setting) can be small.

In the embodiment, the n-type semiconductor layer 20S is provided in the second electrode 20. Thereby, for example, a depletion layer 20d is formed in the semiconductor layer 20S in the set operation. The operating current can be even smaller due to the depletion layer 20d. On the other hand, the depletion layer 20d is not formed in the reset operation in which a current of the reverse direction is caused to flow; and good characteristics can be maintained.

Thus, in the memory device 110 according to the embodiment, the operating current can be reduced.

The work function is relatively large for Ir, Pt, and Ru. Therefore, in the case where the metal-containing region 20M includes at least one metallic element of Ir, Pt, or Ru, for example, the electrons that pass through the oxide layer 30 and reach the semiconductor layer 20S can be suppressed further. Thereby, the effect of reducing the operating current is large. In the case where the metal-containing region 20M includes these metallic elements, for example, the transient current that accompanies the resistance reduction is smaller.

In the case where the metal-containing region 20M includes a nitride of at least one of the first metallic element or the second metallic element, for example, the oxidization due to the heat treatment of the manufacturing process can be suppressed. Thereby, for example, the increase of the operating voltage can be suppressed.

For example, the work function of the first metallic element is large. For example, the first metallic element does not oxidize easily. When the first metallic element is oxidized, the resistance of the oxide of the first metallic element is low.

On the other hand, the price of the second metallic element is inexpensive. Etching residue is small and the process compatibility is high for the second metallic element.

For example, there are cases where the stacked body SB is processed at a high temperature in the formation of the memory device 110. For example, the oxide layer 30 is formed at a high temperature. For example, the oxidation resistance of Pt is high. In the embodiment, in the case where the metal-containing region 20M includes Pt, the change of the metal-containing region 20M due to the high-temperature processing, etc., can be suppressed. For example, in the case where the metal-containing region 20M includes Pt, the change of the electrical characteristics (e.g., the resistance) of the stacked body SB can be suppressed.

On the other hand, the conductivity is relatively low for an oxide of Ir and an oxide of Ru. In the case where the metal-containing region 20M includes at least one of Ir or Ru, a low conductivity can be maintained even in the case where oxidization occurs in the metal-containing region 20M. Thereby, the increase of the resistance of the metal-containing region 20M when oxidization occurs can be suppressed.

For example, in the case where the metal-containing region 20M includes Ru and the thickness tM of the metal-containing region 20M is about 1 nm, the set current (the operating current) is about 90% of the set current in the case where the metal-containing region 20M is not provided.

It is favorable for the thickness tM of the metal-containing region 20M to be not less than 0.05 nm but less than 3 nm. The thickness tM may be 1 nm or less. The metal-containing region 20M may have an island configuration or a mesh configuration.

For example, the thickness tM is thinner than a thickness t3 of the oxide layer 30 (the length of the oxide layer 30 along the Z-axis direction) (referring to FIG. 1A). The thickness tM is thinner than a thickness tS of the semiconductor layer 20S (the length of the semiconductor layer 20S along the Z-axis direction).

In the embodiment, the nitrogen-containing region 20N is provided between the metal-containing region 20M and the semiconductor layer 20S. Thereby, as shown in FIG. 2, the band offset 20B that is formed in the region between the metal-containing region 20M and the semiconductor layer 20S is larger than that of the case where the nitrogen-containing region 20N is not provided. Thereby, the electrons that flow through the oxide layer 30 and flow into the semiconductor layer 20S are suppressed further. Thereby, the operating current (e.g., the current after the setting) can be reduced further.

It is considered that the metallic element included in the metal-containing region 20M enters the semiconductor layer 20S due to, for example, diffusion, etc. In such a case, the width of the depletion layer 20d illustrated in FIG. 2 becomes small By providing the nitrogen-containing region 20N, for example, the penetration into the semiconductor layer 20S of the metallic element included in the metal-containing region 20M can be suppressed. The nitrogen-containing region 20N may have, for example, a blocking function.

Thereby, for example, the depletion layer 20d can be formed stably; and the operating current can be reduced stably.

In the embodiment, for example, the current does not flow easily if the thickness tN of the nitrogen-containing region 20N is excessively thick. For example, the thickness tN is thinner than the thickness t3 of the oxide layer 30 (referring to FIG. 1A). The thickness tN is thinner than the thickness tS of the semiconductor layer 20S. The thickness tN is, for example, 1 nanometer (nm) or less. The thickness tN is, for example, less than 0.5 nm. The thickness tN may be a thickness corresponding to one atomic layer thick or less. Thereby, it is possible for a current to flow in the nitrogen-containing region 20N. As described above, the nitrogen-containing region 20N may have an island configuration, a mesh configuration, etc. The thickness tN is the average length of the nitrogen-containing region 20N along the Z-axis direction.

FIG. 3 is a graph illustrating characteristics of the memory device.

FIG. 3 illustrates XPS (X-ray Photoelectron Spectroscopy) analysis results of the surfaces of samples in which a SiN layer, a metal layer, and a $HfO_2$ layer are formed sequentially in this order on a semiconductor substrate. The semiconductor substrate corresponds to the semiconductor layer 20S. The SiN layer corresponds to the nitrogen-containing region 20N. The metal layer corresponds to the metal-containing region 20M. The $HfO_2$ layer corresponds to the oxide layer 30. The results when the material of the metal layer is Ti (titanium), W (tungsten), or Ru (ruthenium) are shown in FIG. 2. For the three types of samples, the thickness tN of the SiN layer (the nitrogen-containing region 20N) is 5 nm. The thickness tM of the metal layer (the metal-containing region 20M) is 5 nm. The thickness t3 of the $HfO_2$ layer (the oxide layer 30) is 5 nm. In FIG. 3, the horizontal axis is a heat treatment temperature Temp (° C.). The vertical axis is a detection intensity Int of the XPS (arbitrary units).

As shown in FIG. 3, for the case where the metal layer is Ti, the metal (Ti) is detected at the surface of the sample (the surface of the $HfO_2$ layer) when the temperature Temp of the heat treatment is high. In the case where the metal layer is W as well, the metal (W) is detected at the surface of the sample when the temperature Temp of the heat treatment is high. The detection intensity Int (the amount) in the case of W is lower than the detection amount Int (the amount) in the case of Ti. On the other hand, in the case where the metal layer is Ru, the detection intensity Int of the metal (Ru) at the surface of the sample is substantially zero even when the temperature Temp of the heat treatment is high. Ru substantially is not detected.

For example, it is considered that the metallic element passing through the oxide layer 30 is suppressed by using Ru as the metallic element of the metal-containing region 20M. It is considered that the negative effects on the characteristics of the oxide layer 30 are suppressed.

Figure 4:
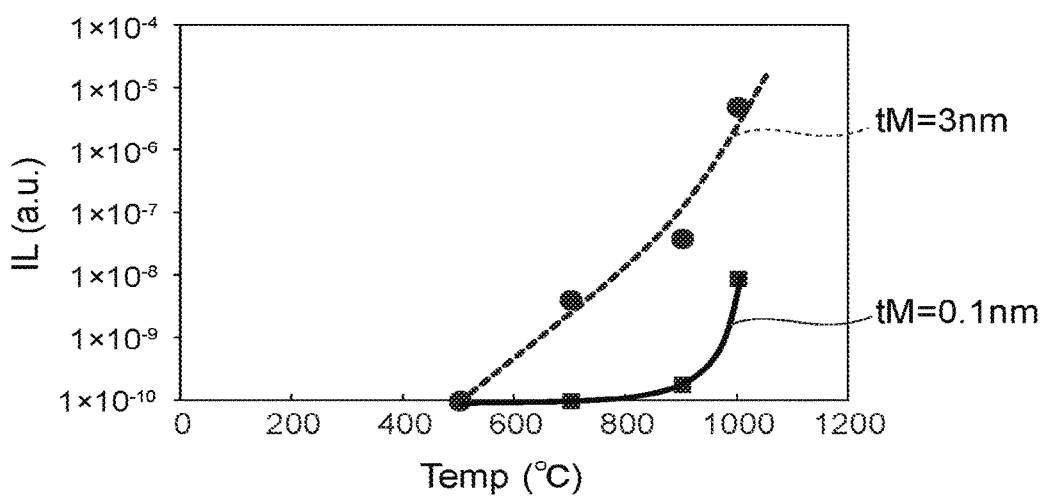
FIG. 4 is a graph illustrating characteristics of the memory device.

FIG. 4 is a graph illustrating characteristics of the memory device.

FIG. 4 shows the measurement results of the leakage current of samples in which a SiN layer, a Ti layer, and a $HfO_2$ layer are formed sequentially in this order on a semiconductor substrate. The semiconductor substrate corresponds to the semiconductor layer 20S. The thickness tN of the SiN layer (the nitrogen-containing region 20N) is 5 nm. The thickness tM of the Ti layer (the metal-containing region 20M) is 0.1 nm or 3 nm. The thickness t3 of the $HfO_2$ layer (the oxide layer 30) is 6 nm. In FIG. 4, the horizontal axis is the heat treatment temperature Temp (° C.). The vertical axis is the leakage current IL (arbitrary units).

As shown in FIG. 4, in the case where the thickness tM of the Ti layer (the metal-containing region 20M) is 3 nm, the leakage current IL becomes large when the temperature Temp of the heat treatment is high. Conversely, the increase of the leakage current is suppressed in the case where the thickness tM is 0.1 nm.

Figure 5A:
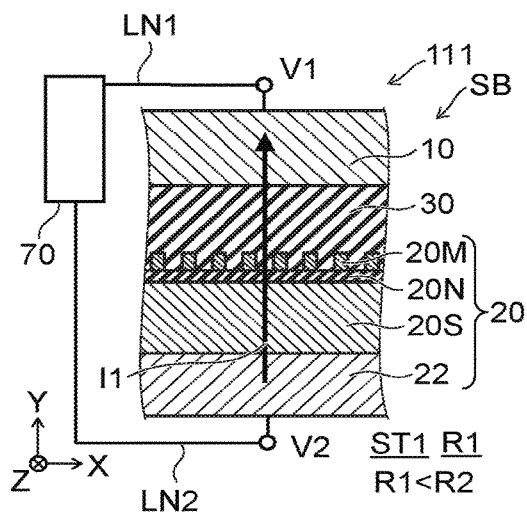
FIG. 5A and FIG. 5B are schematic cross-sectional views illustrating another memory device according to the first embodiment.
Figure 5B:
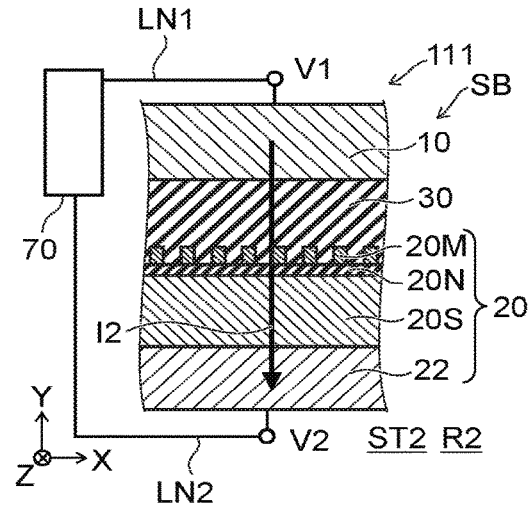

FIG. 5A and FIG. 5B are schematic cross-sectional views illustrating another memory device according to the first embodiment.

In the other memory device 111 according to the embodiment as shown in these drawings, the metal-containing region 20M has an island configuration or a mesh configuration. The metal-containing region 20M is provided between a portion of the semiconductor layer 20S and a portion of the oxide layer 30 in the Z-axis direction. Otherwise, the memory device 111 is similar to the memory device 110; and a description is therefore omitted.

In the memory device 111 as well, the flow into the semiconductor layer 20S of the electrons flowing through the oxide layer 30 in the set operation is suppressed by the band offset 20B. Thereby, the operating current can be small. The operating current can be even smaller due to the depletion layer 20d.

Figure 6A:
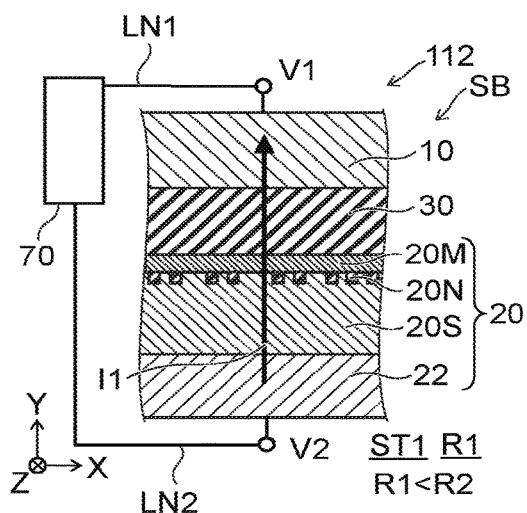
FIG. 6A and FIG. 6B are schematic cross-sectional views illustrating another memory device according to the first embodiment.
Figure 6B:
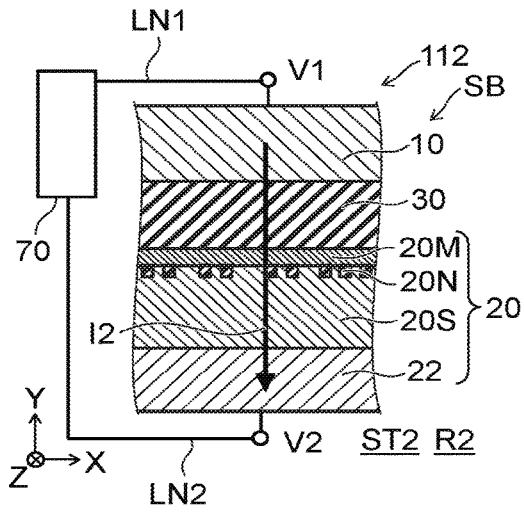

FIG. 6A and FIG. 6B are schematic cross-sectional views illustrating another memory device according to the first embodiment.

In the other memory device 112 according to the embodiment as shown in these drawings, the nitrogen-containing region 20N has an island configuration or a mesh configuration. The nitrogen-containing region 20N is provided between a portion of the semiconductor layer 20S and a portion of the metal-containing region 20M in the Z-axis direction. Otherwise, the memory device 112 is similar to the memory device 110; and a description is therefore omitted.

In the memory device 112 as well, the flow into the semiconductor layer 20S of the electrons flowing through the oxide layer 30 in the set operation is suppressed by the band offset 20B. Thereby, the operating current can be small. The operating current can be even smaller due to the depletion layer 20d. Because the nitrogen-containing region 20N has the island configuration or the mesh configuration, for example, the resistance of the nitrogen-containing region 20N can be low. Thereby, for example, the operating voltage can be low.

In the embodiment, both the metal-containing region 20M and the nitrogen-containing region 20N may have island configurations or mesh configurations.

Figures 7A, 7B:
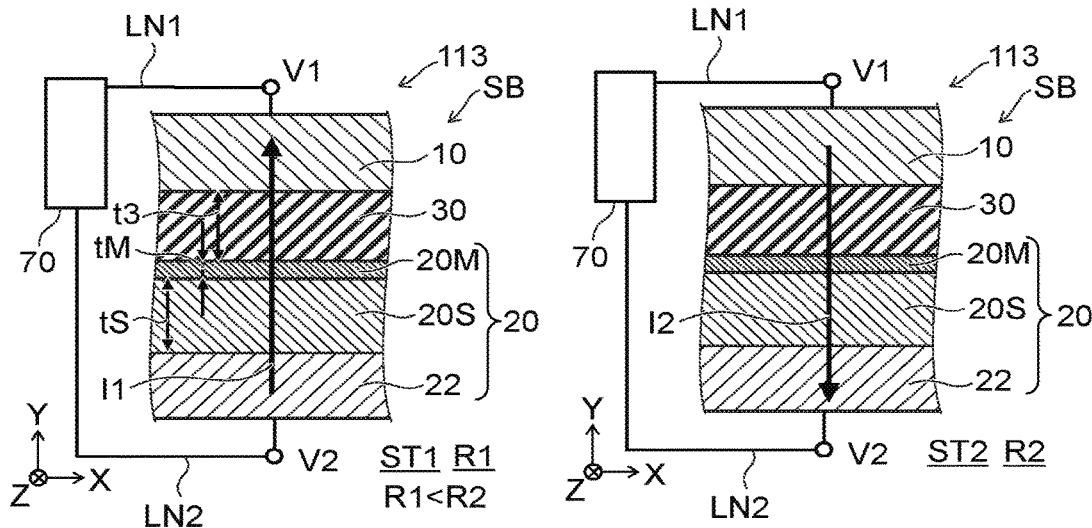
FIG. 7A and FIG. 7B are schematic cross-sectional views illustrating another memory device according to the first embodiment.

FIG. 7A and FIG. 7B are schematic cross-sectional views illustrating another memory device according to the first embodiment.

The nitrogen-containing region 20N is omitted from the other memory device 113 according to the embodiment as shown in these drawings. Otherwise, the memory device 113 is similar to the memory device 110; and a description is therefore omitted.

Figure 8:
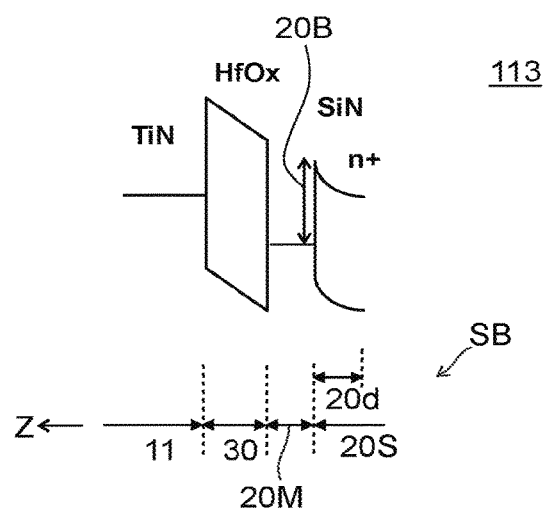
FIG. 8 is a schematic view illustrating the memory device according to the first embodiment.

FIG. 8 is a schematic view illustrating the memory device according to the first embodiment.

FIG. 8 is an energy band diagram of the stacked body SB of the memory device 113.

As shown in FIG. 8, in the embodiment as well, the band offset 20B is formed in the region between the semiconductor layer 20S and the metal-containing region 20M. The flow into the semiconductor layer 20S of the electrons flowing through the oxide layer 30 in the set operation is suppressed by the band offset 20B. Thereby, the operating current can be small. The operating current can be even smaller due to the depletion layer 20d.

Because the nitrogen-containing region 20N is not provided in the memory device 113, the resistance of the stacked body SB can be low compared to the case where the nitrogen-containing region 20N is provided. For example, the operating voltage can be reduced.

In the memory device 113, at least a portion of the metal-containing region 20M contacts the semiconductor layer 20S. For example, a silicide may be formed of the metallic element included in the metal-containing region 20M and the silicon included in the semiconductor layer 20S.

For example, titanium silicide may be formed in the case where the metal-containing region 20M includes Ti. The silicide is formed by forming a film used to form the metal-containing region 20M on the semiconductor layer 20S and by subsequently performing heat treatment. For example, the contact resistance is reduced by forming the silicide. For example, the thermal stability is improved by forming the silicide. For example, the oxidation resistance is improved by forming the silicide.

For example, the film (e.g., the Ti film) that is used to form the metal-containing region 20M may be formed on the semiconductor layer 20S; and the oxide layer 30 may be formed after forming the silicide by the heat treatment. If the oxide layer 30 is formed without performing the heat treatment after forming the film (e.g., Ti) recited above, a metal oxide (an oxide of Ti) is formed easily; and the silicide is not formed easily.

FIG. 9A and FIG. 9B are schematic cross-sectional views illustrating another memory device according to the first embodiment.

In the other memory device 114 according to the embodiment as shown in these drawings, the metal-containing region 20M has an island configuration or a mesh configuration. The metal-containing region 20M is provided between a portion of the semiconductor layer 20S and a portion of the oxide layer 30 in the Z-axis direction. Otherwise, the memory device 114 is similar to the memory device 113; and a description is therefore omitted.

In the memory device 114 as well, the flow into the semiconductor layer 20S of the electrons flowing through the oxide layer 30 in the set operation is suppressed by the band offset 20B. Thereby, the operating current can be small. The operating current can be even smaller due to the depletion layer 20d.

In the embodiment, the thickness t3 of the oxide layer 30 is, for example, not less than 2 nm and not more than 7 nm. In the case where the thickness t3 is less than 2 nm, for example, the resistance is low from the initial state in which the voltage is not applied; and there are cases where the resistance substantially does not change. In the case where the thickness t3 exceeds 7 nm, for example, the voltage at which the resistance decreases is excessively high. In the case where the thickness t3 exceeds 7 nm, even if the resistance is reduced, there are cases where the resistance after the resistance change is low. In the case where the thickness t3 is not less than 2 nm and not more than 7 nm, for example, good resistance change characteristics are obtained.

In the embodiment, the oxide layer 30 includes, for example, a metal oxide (e.g., a transition metal oxide). The metal (including a transition metal) that is included in the oxide layer 30 includes, for example, at least one of hafnium (Hf), chrome (Cr), tungsten (W), vanadium (V), niobium (Nb), tantalum (Ta), titanium (Ti), zirconium (Zr), scandium (Sc), yttrium (Y), thorium (Tr), cobalt (Co), nickel (Ni), copper (Cu), zinc (Zn), cadmium (Cd), aluminum (Al), gallium (Ga), tin (Sn), lead (Pb), antimony (Sb), or bismuth (Bi). The oxide layer 30 is, for example, a metal oxide layer.

The oxide layer 30 may include, for example, an oxide of a rare-earth element. The rare-earth element is, for example, an element from lanthanum (La) to lutetium (Lu) of the periodic table.

At least one of the first electrode 10 or the conductive layer 22 includes, for example, at least one of Pt, Au, Ag, TiAlN, SrRuO, Ru, RuN, Ir, Co, Ti, TiN, TaN, LaNiO, Al, PtIrO$_x$, PtRhO$_x$, or W. In the case where at least one of the first electrode 10 or the conductive layer 22 includes Rh, the at least one may include a stacked film including a film including TaAlN.

Second Embodiment

FIG. 10A and FIG. 10B are schematic cross-sectional views illustrating a memory device according to a second embodiment.

As shown in FIG. 10A and FIG. 10B, the memory device 120 according to the embodiment also includes the stacked body SB. The stacked body SB includes the first electrode 10, the second electrode 20, and the oxide layer 30. The oxide layer 30 is provided between the first electrode 10 and the second electrode 20. In the embodiment as well, the second electrode 20 includes the semiconductor layer 20S and the metal-containing region 20M. In the embodiment, the semiconductor layer 20S is of the p-type. The semiconductor layer 20S includes, for example, p-type polysilicon, etc. The semiconductor layer 20S includes, for example, silicon. The semiconductor layer 20S further includes boron (an impurity). Otherwise, the memory device 120 is similar to the memory device 110; and a description is therefore omitted.

In the embodiment as well, the resistance of the stacked body SB changes. FIG. 10A shows an example of the first state ST1. FIG. 10B shows an example of the second state ST2. The first state ST1 is obtained by causing the first current I1 to flow in the stacked body SB from the second electrode 20 toward the first electrode 10. The second state ST2 is obtained by causing the second current I2 to flow in the stacked body SB from the first electrode 10 toward the second electrode 20.

In the memory device 120, the first resistance R1 of the stacked body SB in the first state ST1 is higher than the second resistance R2 of the stacked body SB in the second state ST2. In the memory device 120, the operation of forming the first state ST1 (the operation of causing the first current I1 to flow in the stacked body SB) corresponds to, for example, the reset operation. The operation of forming the second state ST2 (the operation of causing the second current I2 to flow in the stacked body SB) corresponds to, for example, the set operation.

Thus, in the memory device 120, the direction of the current flowing in the set operation is the reverse of that of the memory device 110. In the memory device 120, the direction of the current flowing in the reset operation is the reverse of that of the memory device 110.

In the memory device 120 as well, the operating current (the cell current) can be small.

Figure 11:
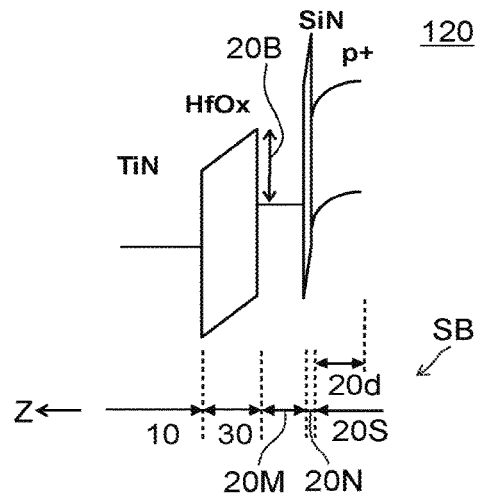
FIG. 11 is a schematic view illustrating the memory device according to the second embodiment.

FIG. 11 is a schematic view illustrating the memory device according to the second embodiment.

FIG. 11 is an energy band diagram of the stacked body SB of the memory device 120.

As shown in FIG. 11, the metal-containing region 20M is provided in the embodiment. Thereby, the band offset 20B is formed in the region between the oxide layer 30 and the metal-containing region 20M. In the embodiment, the p-type semiconductor layer 20S is provided in the second electrode 20. Thereby, for example, the depletion layer 20d is formed in the semiconductor layer 20S in the set operation. The current that flows in the semiconductor layer 20S is limited by the depletion layer 20d. The flow into the oxide layer 30 of the electrons passing through the depletion layer 20d is suppressed by the band offset 20B formed by the metal-containing region 20M. Therefore, the operating current is small. On the other hand, the depletion layer 20d is not formed in the reset operation of causing the current to flow in the reverse direction; and good characteristics can be maintained.

Thus, in the memory device 120 according to the embodiment as well, the operating current can be reduced.

In the memory device 120, the nitrogen-containing region 20N is provided between the metal-containing region 20M and the semiconductor layer 20S. The movement of the electrons passing through the semiconductor layer 20S is suppressed by the high bandgap of the nitrogen-containing region 20N (e.g., SiN). Thereby, the flow into the oxide layer 30 of the electrons flowing through the semiconductor layer 20S is further suppressed. Thereby, the operating current can be reduced further.

For example, the oxide layer 30 is changed from a high resistance state to a low resistance state by the set operation. The depletion layer 20d and the band offset 20B are provided in the embodiment. Thereby, the current that flows when the oxide layer 30 has changed from the high resistance state to the low resistance state can be small. The current that flows in the semiconductor layer 20S after setting is small. Therefore, the current that flows in the oxide layer 30 also is small. Thereby, the operating current can be small.

By providing the nitrogen-containing region 20N, for example, the diffusion of the metallic element included in the metal-containing region 20M into the semiconductor layer 20S can be suppressed. Thereby, for example, the depletion layer 20d can be formed stably; and the operating current can be reduced stably.

In the embodiment, for example, the thickness tN is thinner than the thickness t3 of the oxide layer 30 (referring to FIG. 10A). The thickness tN is thinner than the thickness tS of the semiconductor layer 20S. The thickness tN is, for example, 1 nm or less. The thickness tN is, for example, less than 0.5 nm. The thickness tN may be a thickness corresponding to one atomic layer thick or less. It is possible for a current to flow in the nitrogen-containing region 20N. The nitrogen-containing region 20N may have an island configuration, a mesh configuration, etc. The thickness tN is the average length of the nitrogen-containing region 20N along the Z-axis direction.

Figures 12A, 12B:
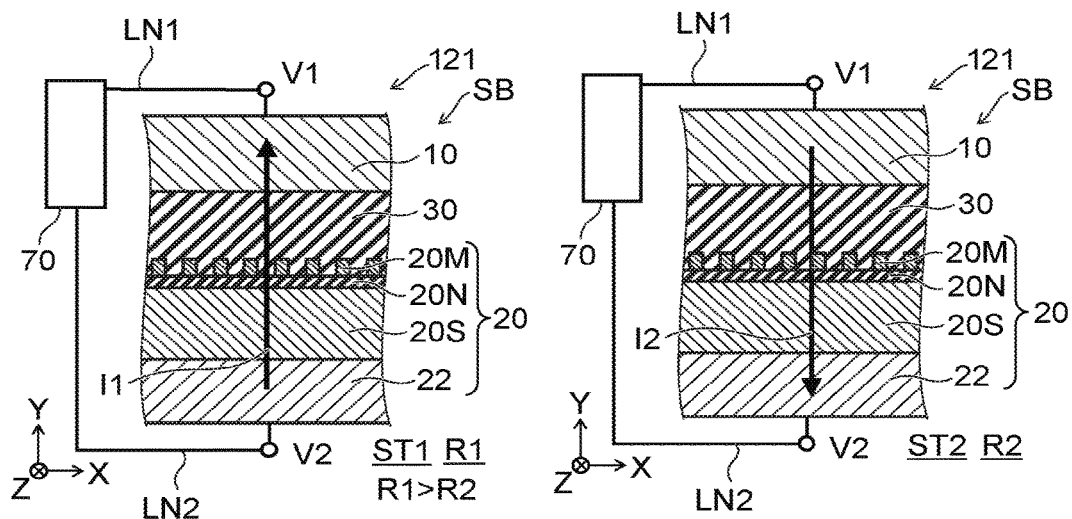
FIG. 12A and FIG. 12B are schematic cross-sectional views illustrating another memory device according to the second embodiment.

FIG. 12A and FIG. 12B are schematic cross-sectional views illustrating another memory device according to the second embodiment.

In the other memory device 121 according to the embodiment, the metal-containing region 20M has an island configuration or a mesh configuration. The metal-containing region 20M is provided between a portion of the semiconductor layer 20S and a portion of the oxide layer 30 in the Z-axis direction. Otherwise, the memory device 121 is similar to the memory device 120; and a description is therefore omitted.

Figure 13A:
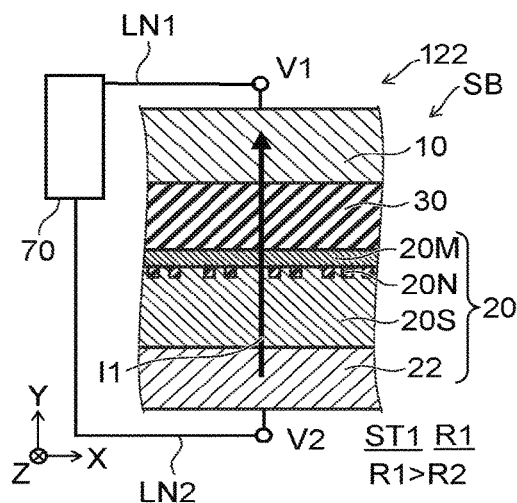
FIG. 13A and FIG. 13B are schematic cross-sectional views illustrating another memory device according to the second embodiment.
Figure 13B:
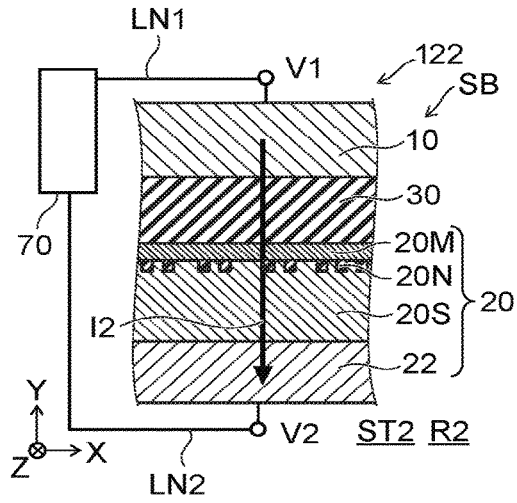

FIG. 13A and FIG. 13B are schematic cross-sectional views illustrating another memory device according to the second embodiment.

In the other memory device 122 according to the embodiment, the nitrogen-containing region 20N has an island configuration or a mesh configuration. The nitrogen-containing region 20N is provided between a portion of the semiconductor layer 20S and a portion of the metal-containing region 20M in the Z-axis direction. Otherwise, the memory device 122 is similar to the memory device 120; and a description is therefore omitted.

In the memory devices 121 and 122 as well, the oxide layer 30 is changed from the high resistance state to the low resistance state by the set operation. The depletion layer 20d and the band offset 20B are provided in the embodiment. Thereby, the current that flows when the oxide layer 30 has changed from the high resistance state to the low resistance state can be small; and the operating current can be small.

Because the nitrogen-containing region 20N has the island configuration or the mesh configuration in the memory device 122, for example, the resistance of the nitrogen-containing region 20N can be low. Thereby, for example, the operating voltage can be low. In the embodiment, both the metal-containing region 20M and the nitrogen-containing region 20N may have island configurations or mesh configurations.

Figure 14A:
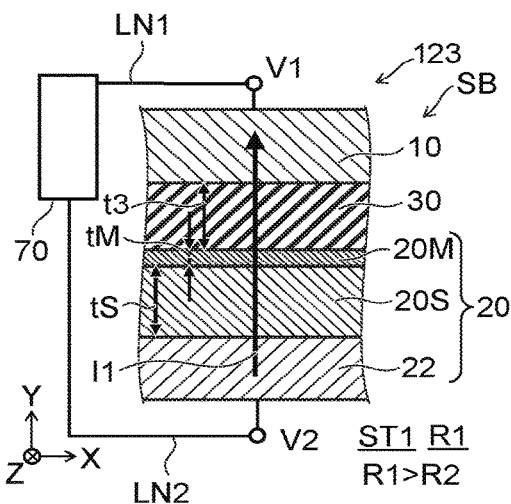
FIG. 14A and FIG. 14B are schematic cross-sectional views illustrating another memory device according to the second embodiment.
Figure 14B:
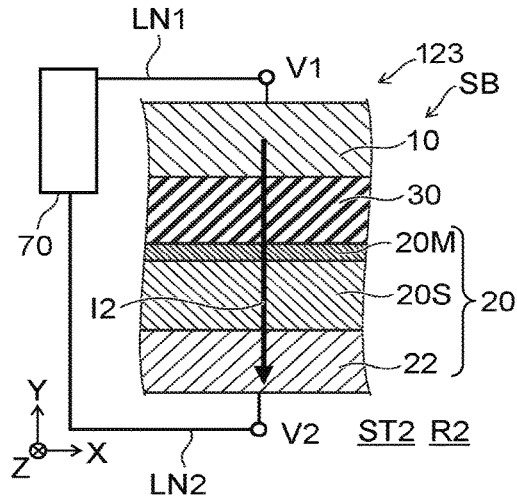

FIG. 14A and FIG. 14B are schematic cross-sectional views illustrating another memory device according to the second embodiment.

The nitrogen-containing region 20N is omitted from the other memory device 123 according to the embodiment. Otherwise, the memory device 123 is similar to the memory device 110; and a description is therefore omitted.

Figure 15:
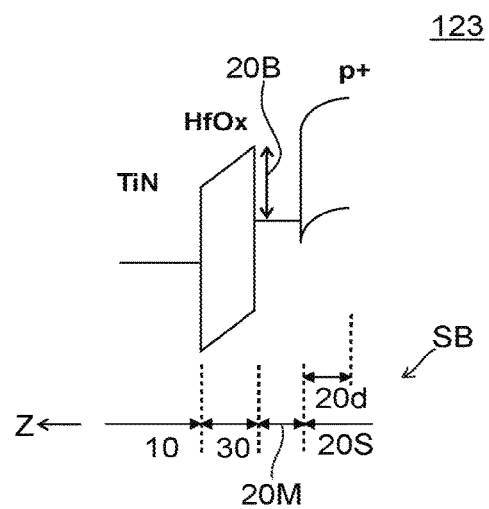
FIG. 15 is a schematic view illustrating the memory device according to the second embodiment.

FIG. 15 is a schematic view illustrating the memory device according to the second embodiment.

FIG. 15 is an energy band diagram of the stacked body SB of the memory device 123.

As shown in FIG. 15, in the embodiment as well, the band offset 20B is formed in the region between the oxide layer 30 and the metal-containing region 20M. The oxide layer 30 is changed from the high resistance state to the low resistance state by the set operation. The depletion layer 20d and the band offset 20B are provided in the embodiment. Thereby, the current that flows when the oxide layer 30 has changed from the high resistance state to the low resistance state can be small; and the operating current can be small.

Because the nitrogen-containing region 20N is not provided in the memory device 123, the resistance of the stacked body SB can be low compared to the case where the nitrogen-containing region 20N is provided. For example, the operating voltage can be reduced.

In the memory device 123, at least a portion of the metal-containing region 20M contacts the semiconductor layer 20S. For example, a silicide may be formed of the metallic element included in the metal-containing region 20M and the silicon included in the semiconductor layer 20S.

Figures 16A, 16B:
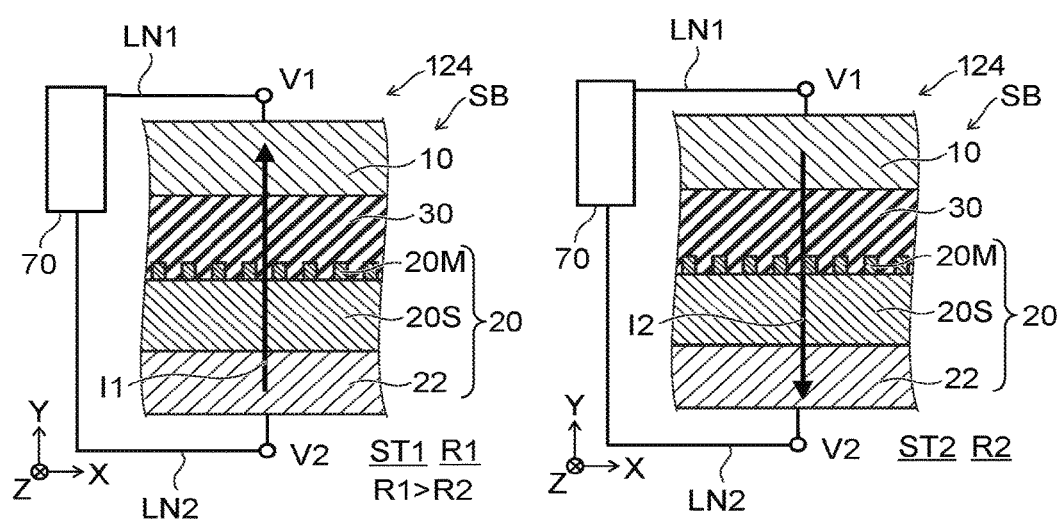
FIG. 16A and FIG. 16B are schematic cross-sectional views illustrating another memory device according to the second embodiment.

FIG. 16A and FIG. 16B are schematic cross-sectional views illustrating another memory device according to the second embodiment.

In the other memory device 124 according to the embodiment, the metal-containing region 20M has an island configuration or a mesh configuration. The metal-containing region 20M is provided between a portion of the semiconductor layer 20S and a portion of the oxide layer 30 in the Z-axis direction. Otherwise, the memory device 124 is similar to the memory device 123; and a description is therefore omitted.

In the memory device 124 as well, the flow into the oxide layer 30 of the electrons flowing through the semiconductor layer 20S in the set operation is suppressed by the band offset 20B. Thereby, the operating current can be small. The operating current can be even smaller due to the depletion layer 20d.

The depletion layer 20d and the band offset 20B are provided in the memory device 124 as well. Thereby, the current that flows when the oxide layer 30 has changed from the high resistance state to the low resistance state can be small. The current that flows in the semiconductor layer 20S after setting is small. Therefore, the current that flows in the oxide layer 30 also is small. Thereby, the operating current can be small.

In the memory device according to the second embodiment, the materials described in reference to the first embodiment may be included in the first electrode 10, the oxide layer 30, the metal-containing region 20M, the nitrogen-containing region 20N, and the conductive layer 22.

Third Embodiment

A memory device 130 according to the embodiment is, for example, a cross-point memory device.

Figure 17:
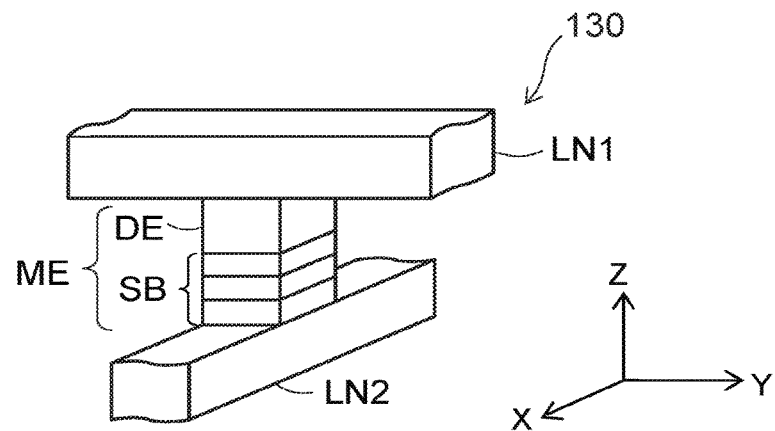
FIG. 17 is a schematic perspective view illustrating the memory device according to the third embodiment.

FIG. 17 is a schematic perspective view illustrating the memory device according to the third embodiment.

As shown in FIG. 17, the memory device 130 according to the embodiment includes the first interconnect LN1, the second interconnect LN2, and the stacked body SB. Any stacked body SB or modification of the stacked body SB according to the first and second embodiments is applicable to the stacked body SB.

For example, the first interconnect LN1 extends in the Y-axis direction. The second interconnect LN2 extends in the X-axis direction. A memory component ME is provided at the position where these interconnects cross. The memory component ME includes the stacked body SB.

In the example, the memory component ME further includes a rectifying element DE (e.g., a diode). The rectifying element DE is connected in series with the stacked body SB. For example, the forward direction of the rectifying element DE corresponds to the direction of the set current of the stacked body SB. The rectifying element DE suppresses the sneak current when programming/reading.

Figure 18:
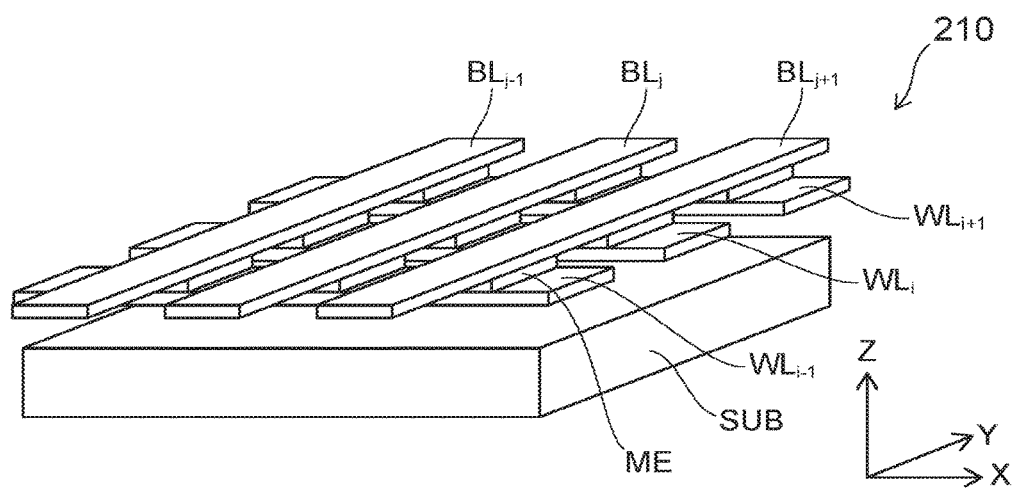
FIG. 18 is a schematic perspective view illustrating a memory device according to the third embodiment.

FIG. 18 is a schematic perspective view illustrating a memory device according to the third embodiment.

As shown in FIG. 18, a substrate SUB is provided in the memory device 210 according to the embodiment. A plane that is parallel to a major surface of the substrate SUB corresponds to the X-Y plane.

In the memory device 210, multiple word lines (word lines $WL_{i-1}$, $WL_i$, $WL_{i+1}$, etc.) and multiple bit lines (bit lines $BL_{j-1}$, $BL_j$, $BL_{j+1}$, etc.) are provided on the major surface of the substrate SUB. The index i and the index j recited above are arbitrary. The number of word lines and the number of bit lines are arbitrary. For example, the word line corresponds to the second interconnect LN2. The bit line corresponds to the first interconnect LN1.

For example, the multiple word lines are parallel to each other. For example, the multiple bit lines are parallel to each other. The multiple word lines are non-parallel to the multiple bit lines. In the example, the word lines extend in the X-axis direction. The bit lines extend in the Y-axis direction. The memory components ME are provided between the word lines and the bit lines.

Figure 19:
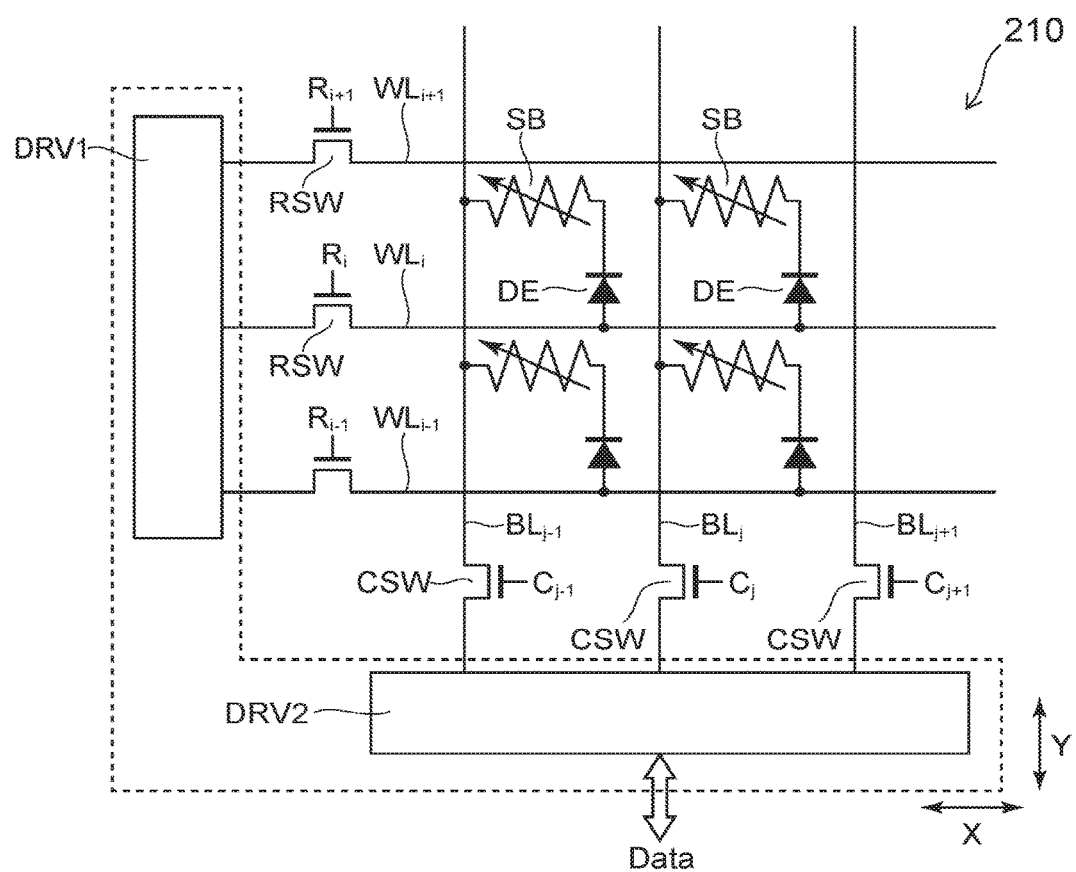
FIG. 19 is a schematic view illustrating the memory device according to the third embodiment.

FIG. 19 is a schematic view illustrating the memory device according to the third embodiment.

As shown in FIG. 19, for example, one end of each of the word lines $WL_{i-1}$, $WL_i$, and $WL_{i+1}$ is connected to a word line driver DRV1 via a MOS transistor RSW. The MOS transistors RSW are, for example, selection switches. For example, the word line driver DRV1 has a decoder function.

One end of each of the bit lines $BL_{j-1}$, $BL_j$, and $BL_{j+1}$ is connected to a bit line driver DRV2 via a MOS transistor CSW. The MOS transistors CSW are, for example, selection switches. For example, the bit line driver DRV2 has a decoder function and a read function.

Selection signals $R_{i-1}$, $R_i$, and $R_{i+1}$ for selecting the word lines (the rows) are input to the gates of the MOS transistors RSW. Selection signals $C_{j-1}$, $C_j$, and $C_{j+1}$ for selecting the bit lines (the columns) are input to the gates of the MOS transistors CSW.

The memory components ME are disposed at the crossing portions where the word lines $WL_{i-1}$, $WL_i$, and $WL_{i+1}$ and the bit lines $BL_{j-1}$, $BL_j$, and $BL_{j+1}$ oppose each other.

Figure 20:
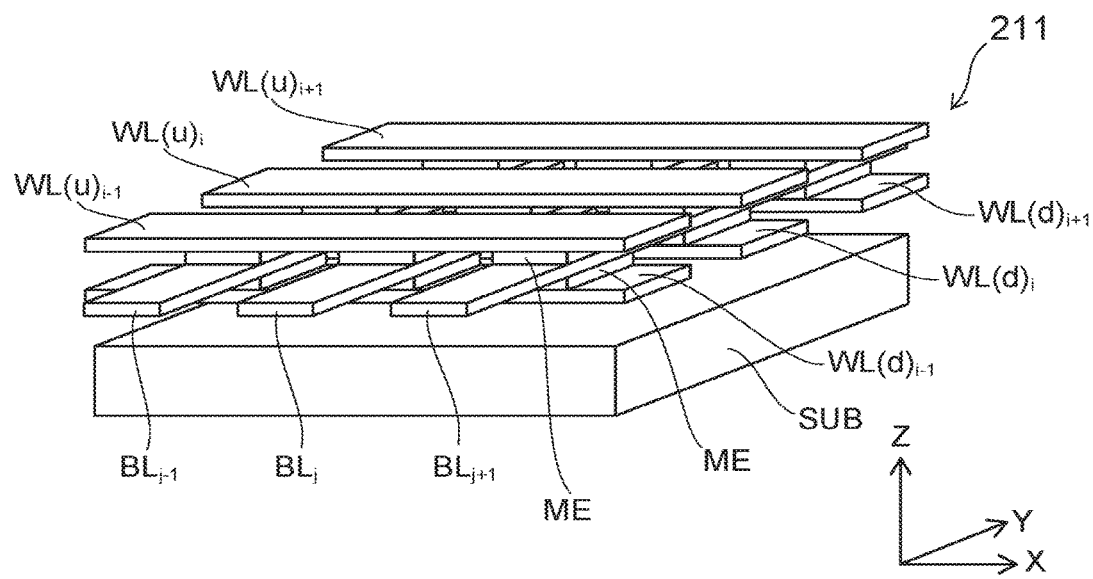
FIG. 20 is a schematic perspective view illustrating the configurations of another memory device according to the third embodiment.
Figure 21:
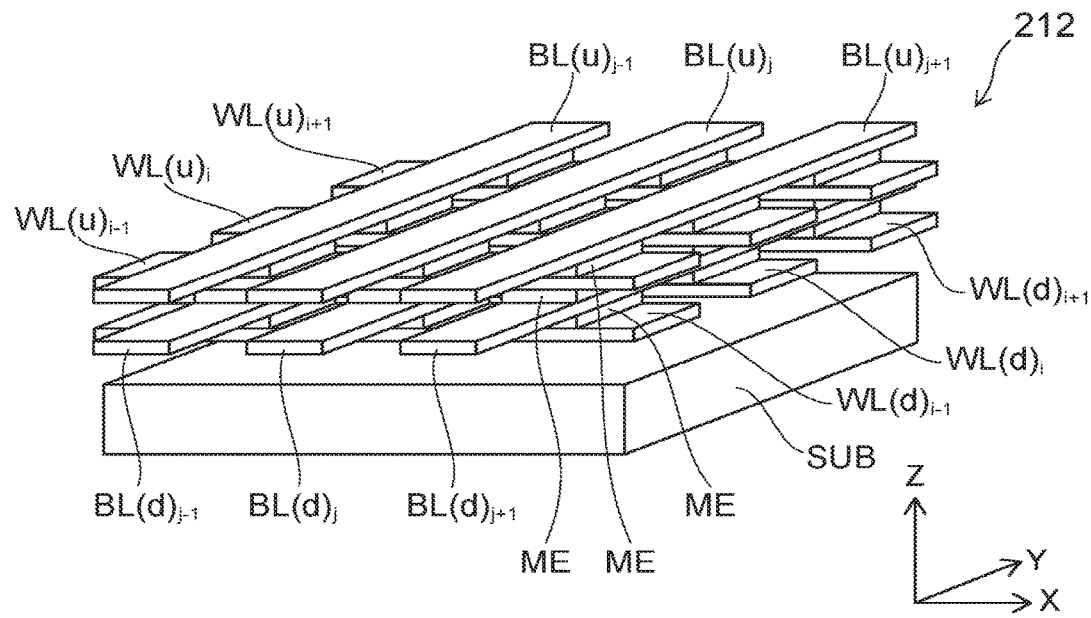
FIG. 21 is a schematic perspective view illustrating the configurations of another memory device according to the third embodiment.

FIG. 20 and FIG. 21 are schematic perspective views illustrating the configurations of other memory devices according to the third embodiment.

As shown in FIG. 20 and FIG. 21, multiple structure bodies are provided in the memory devices 211 and 212 according to the embodiment. The structure bodies include word lines, bit lines, and the memory components ME provided respectively between the word lines and the bit lines. Such multiple stacked structure bodies are stacked along the Z-axis direction. Thereby, a memory device that has a three-dimensional structure is formed.

In the memory devices 210, 211, and 212, for example, the word line driver DRV1 and the bit line driver DRV2 are included in the controller 70. The controller 70 may further include at least one of the MOS transistor RSW or the MOS transistor CSW. The controller 70 performs, via the word line $WL_i$ and the bit line $BL_j$, at least one of applying a voltage to the stacked body SB or providing a current to the stacked body SB. Thereby, the state of the stacked body SB is changed; and the information is programmed. For example, the controller 70 programs the information by causing the change of the stacked body SB by applying the voltage to the stacked body SB. The controller 70 can read the information that is programmed. Also, erasing can be performed.

In the memory devices 210, 211, and 212 as well, a memory device can be provided in which the operating current can be reduced.

According to the embodiments, a memory device can be provided in which the operating current can be reduced.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in memory devices such as first electrodes, second electrodes, oxide layers, semiconductor layers, metal-containing regions, nitrogen-containing regions, conductive layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all memory devices practicable by an appropriate design modification by one skilled in the art based on the memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device, comprising:
    a stacked body including
        a first electrode,
        a second electrode, and
        an oxide layer provided between the first electrode and the second electrode, the second electrode including
        a semiconductor layer of an n-type, and
        a metal-containing region including at least one of a first metallic element and a second metallic element and being provided between at least a portion of the semiconductor layer and at least a portion of the oxide layer,
    the first metallic element including at least one selected from the group consisting of Pt, Pd, Ir, Ru, Re, and Os,
    the second metallic element including at least one selected from the group consisting of Ti, W, Mo, and Ta,
    the stacked body having a first state and a second state, the first state being obtained by causing a first current to flow in the stacked body from the second electrode toward the first electrode, the second state being obtained by causing a second current to flow in the stacked body from the first electrode toward the second electrode,
    a first resistance of the stacked body in the first state being lower than a second resistance of the stacked body in the second state,
    wherein, a thickness of the metal-containing region along a first direction is thinner than a thickness of the oxide layer along the first direction, the first direction being from the second electrode toward the first electrode, and
    the second electrode further includes a nitrogen-containing region including Si and N and being provided between at least a portion of the semiconductor layer and at least a portion of the metal-containing region.

2. The device according to claim 1, wherein a thickness of the nitrogen-containing region along the first direction is less than 0.5 nanometers, the first direction being from the second electrode toward the first electrode.

3. The device according to claim 1, wherein the nitrogen-containing region is provided between a portion of the semiconductor layer and a portion of the metal-containing region.

4. The device according to claim 1, wherein the oxide layer is a metal oxide layer.

5. A memory device, comprising:
a first electrode;
a second electrode; and
an oxide layer provided between the first electrode and the second electrode,
the second electrode including
a semiconductor layer of a p-type, and
a metal-containing region including at least one of a first metallic element and a second metallic element and being provided between the semiconductor layer and the oxide layer,
the first metallic element including at least one selected from the group consisting of Pt, Pd, Ir, Ru, Re, and Os,
the second metallic element including at least one selected from the group consisting of Ti, W, Mo, and Ta,
the stacked body having a first state and a second state, the first state being obtained by causing a first current to flow in the stacked body from the second electrode toward the first electrode, the second state being obtained by causing a second current to flow in the stacked body from the first electrode toward the second electrode,
a first resistance of the stacked body in the first state being higher than a second resistance of the stacked body in the second,
wherein, a thickness of the metal-containing region along a first direction is thinner than a thickness of the oxide layer along the first direction, the first direction being from the second electrode toward the first electrode, and
the second electrode further includes a nitrogen-containing region including Si and N and being provided between at least a portion of the semiconductor layer and at least a portion of the metal-containing region.

6. The device according to claim 5, wherein the oxide layer is a metal oxide layer.

7. A memory device, comprising:
a stacked body including
a first electrode,
a second electrode, and
an oxide layer provided between the first electrode and the second electrode, the second electrode including
a semiconductor layer of an n-type, and
a metal-containing region including a first metallic element and being provided between at least a portion of the semiconductor layer and at least a portion of the oxide layer,
the first metallic element including at least one selected from the group consisting of Pt, Pd, Ir, Ru, Re, and Os,
the stacked body having a first state and a second state, the first state being obtained by causing a first current to flow in the stacked body from the second electrode toward the first electrode, the second state being obtained by causing a second current to flow in the stacked body from the first electrode toward the second electrode,
a first resistance of the stacked body in the first state being lower than a second resistance of the stacked body in the second state.

8. The device according to claim 7, wherein a thickness of the metal-containing region along a first direction is thinner than a thickness of the oxide layer along the first direction, the first direction being from the second electrode toward the first electrode.

9. The device according to claim 8, wherein the second electrode further includes a nitrogen-containing region including Si and N and being provided between at least a portion of the semiconductor layer and at least a portion of the metal-containing region.

10. The device according to claim 9, wherein a thickness of the nitrogen-containing region along the first direction is less than 0.5 nanometers, the first direction being from the second electrode toward the first electrode.

11. The device according to claim 9, wherein the nitrogen-containing region is provided between a portion of the semiconductor layer and a portion of the metal-containing region.

12. The device according to claim 7, wherein the oxide layer is a metal oxide layer.

* * * * *